United States Patent
Ghosh

(10) Patent No.: US 9,793,252 B2
(45) Date of Patent: Oct. 17, 2017

(54) METHOD OF INTEGRATING INORGANIC LIGHT EMITTING DIODE WITH OXIDE THIN FILM TRANSISTOR FOR DISPLAY APPLICATIONS

(71) Applicant: eMagin Corporation, Hopewell Junction, NY (US)

(72) Inventor: Amalkumar P. Ghosh, Hopewell Junction, NY (US)

(73) Assignee: eMagin Corporation, Hopewell Junction, NY (US)

( * ) Notice: Subject to any disclaimer, the term of this patent is extended or adjusted under 35 U.S.C. 154(b) by 0 days.

(21) Appl. No.: 15/085,128

(22) Filed: Mar. 30, 2016

(65) Prior Publication Data

US 2016/0293586 A1    Oct. 6, 2016

Related U.S. Application Data

(60) Provisional application No. 62/139,888, filed on Mar. 30, 2015.

(51) Int. Cl.
| | |
|---|---|
| *H01L 25/16* | (2006.01) |
| *H01L 29/66* | (2006.01) |
| *H01L 29/786* | (2006.01) |
| *H01L 25/075* | (2006.01) |
| *H01L 33/50* | (2010.01) |
| *H01L 31/20* | (2006.01) |

(Continued)

(52) U.S. Cl.
CPC ...... *H01L 25/167* (2013.01); *H01L 29/66969* (2013.01); *H01L 29/7869* (2013.01); *G02F 1/1368* (2013.01); *H01L 25/0756* (2013.01); *H01L 33/007* (2013.01)

(58) Field of Classification Search
CPC ............ H01L 27/1225; H01L 27/1463; H01L 27/14687; H01L 31/0368; H01L 31/0376; H01L 31/20; H01L 27/14632; H01L 27/14692; H01L 27/153; H01L 33/505; H01L 33/38; H01L 33/382; H01L 33/46; H01L 33/62; H01L 33/486; H01L 33/10
USPC ............... 257/40, 59, 72, 99, 53; 438/73, 34
See application file for complete search history.

(56) References Cited

U.S. PATENT DOCUMENTS

| | | | |
|---|---|---|---|
| 4,634,474 A | 1/1987 | Camlibel et al. | |
| 5,534,445 A | 7/1996 | Tran et al. | |
| (Continued) | | | |

FOREIGN PATENT DOCUMENTS

| | | |
|---|---|---|
| EP | 0962984 A2 | 12/1999 |
| JP | H111238913 A | 8/1999 |

*Primary Examiner* — Kimberly Rizkallah
*Assistant Examiner* — Brian Turner
(74) *Attorney, Agent, or Firm* — Kaplan Breyer Schwartz, LLP; Janine D. Geraigery, Esq.

(57) ABSTRACT

A method of fabricating an active matrix display is disclosed in which one or more oxide thin film transistors is monolithically integrated with an inorganic light emitting diode structure. The method comprises forming an array of inorganic light emitting diodes over a substrate defining a plurality of sub-pixels, depositing an insulating layer over the inorganic LED array, forming conductive vias through the insulating layer, one via for each LED in the LED array, and forming a metal oxide thin film transistor backplane, including an array of pixel driver circuits, over the dielectric layer and conductive vias, wherein one driver circuit electrically controls each sub-pixel through the dielectric layer.

16 Claims, 5 Drawing Sheets

(51) Int. Cl.
  *H01L 31/0376*   (2006.01)
  *H01L 33/00*   (2010.01)
  *G02F 1/1368*   (2006.01)

(56) References Cited

U.S. PATENT DOCUMENTS

| | | | |
|---|---|---|---|
| 5,637,519 | A | 6/1997 | Tsai et al. |
| 5,959,307 | A | 9/1999 | Nakamura et al. |
| 6,150,668 | A | 11/2000 | Bao et al. |
| 6,166,399 | A | 12/2000 | Zhang et al. |
| 6,753,552 | B1 * | 6/2004 | Lan .................. H01L 33/007 257/103 |
| 6,855,631 | B2 | 2/2005 | Kirby |
| 7,977,868 | B2 | 7/2011 | Shieh et al. |
| 8,530,273 | B2 | 9/2013 | Den Boer |
| 8,912,020 | B2 | 12/2014 | Bedell et al. |
| 8,962,377 | B2 | 2/2015 | Shieh et al. |
| 9,177,918 | B2 | 11/2015 | Peng et al. |
| 9,224,907 | B2 | 12/2015 | Lee et al. |
| 2004/0012033 | A1 | 1/2004 | Yoo |
| 2005/0236636 | A1 | 10/2005 | Hon et al. |
| 2012/0126229 | A1 * | 5/2012 | Bower .............. H01L 21/6835 257/48 |
| 2013/0126890 | A1 | 5/2013 | Bedell et al. |
| 2013/0292731 | A1 * | 11/2013 | Chen ................. H01L 33/22 257/98 |
| 2014/0167046 | A1 | 6/2014 | Shieh et al. |
| 2014/0291688 | A1 | 10/2014 | Tsang |
| 2015/0102359 | A1 | 4/2015 | Bedell et al. |
| 2015/0249197 | A1 * | 9/2015 | Shieh ................ H01L 33/642 257/72 |
| 2015/0380561 | A1 | 12/2015 | Won et al. |
| 2016/0126293 | A1 * | 5/2016 | Li .................... H01L 27/286 257/29 |

* cited by examiner

METHOD OF INTEGRATING INORGANIC LIGHT EMITTING DIODE WITH OXIDE THIN FILM TRANSISTOR FOR DISPLAY APPLICATIONS

CROSS-REFERENCE TO RELATED APPLICATION

This application claims priority to provisional patent application Ser. No. 62/139,888 filed in the United States Patent and Trademark Office on Mar. 30, 2015, the entire disclosure and drawings of which are incorporated in their entirety by reference herein.

FIELD OF THE INVENTION

The present invention relates generally to methods of integrating light emitting diodes (LEDs) with thin film transistors (TFTs) for display applications, and more particularly to a method of monolithically integrating inorganic LEDs with metal oxide TFTs.

BACKGROUND OF THE INVENTION

Two kinds of light emitting diodes (LED) exist today. One is based on organic materials (OLED), while the other one is based on inorganic materials. Both kinds of LEDs essentially work on similar principles wherein positive and negative charge carriers are injected into a semiconducting material and light emission occurs when the charge carriers recombine in the light emission zone of the device stack. Both methods have their own advantages and disadvantages. OLEDs are attractive because such devices need not be produced on a crystalline substrate, the cost of producing such devices is low, the devices are power efficient operating at low voltages, the devices have flexible potential, and the organic material enable devices that emit light in a variety of attractive colors. However, OLEDs devices lack very high brightness and are limited in lifetime. Inorganic LEDs, on the other hand, are attractive because they enable extremely robust devices, which can exhibit very high efficiencies. In addition, the lifetime of inorganic LED devices is extremely long. The notable drawbacks of inorganic LEDs include limitations in fabrication technology and the high cost of fabrication.

Until now, the main problem with fabricating inorganic LED technology for display applications was the drive circuit. Inorganic LEDs are generally made with compound semiconductor material including group III-V or II-VI materials, for example, Gallium Nitride (GaN). Compound semiconductor materials require very high temperature for processing (>700 C). The drivers made using compound semiconductor technology exhibit significantly higher voltages compared to the standard silicon technology such as complimentary metal-oxide semiconductor (CMOS) with single crystal Su, TFTs using a-Si or poly-Si. Therefore, a display device using just GaN had not been feasible. There have been many attempts to combine the Si technology for driving the GaN LEDs to fabricate displays, however, they have been largely unsuccessful. As such, inorganic LEDs are still not a part of the display industry.

The display industry continues to rapidly change with research and developments improvements which reduce power consumption, improve image resolution, and decrease device thickness. While at the same time, the emersion of new trending markets including wearable electronics with flexible and bendable displays, has begun to reshape technology requirements at many levels including the backplane level.

Generally, pixels in a flat panel display are arranged in a matrix form, and generate light (luminescence) upon electrical activation from an array of thin-film-transistors, also known as TFT backplane. A TFT backplane is an important part of display applications as it functions as a series of switches to control the current flowing to each individual pixel. Until recently, there have been two primary types of TFT backplane technologies, one using TFTs with amorphous silicon (a-Si) active layer and the other using TFTs with polycrystalline silicon (poly-Si) active layer. Currently, backplane technologies rely on the presence of conventional silicon materials. The present invention teaches methods of integrating TFTs for display applications using nonconventional materials.

Therefore, there exists a need to provide a feasible and economically viable method of fabricating display devices integrating inorganic LEDs with metal oxide semiconductors (metal oxide TFTs), such as zinc oxide (ZnO) and indium gallium zinc oxide (IGZO).

It is therefore a primary object of the present invention to provide a new and improved method for monolithically integrating inorganic LEDs with metal oxide TFTs using nonconventional materials with high transparency in the visible spectrum and controllable carrier concentration.

It is another object of the present invention to provide a new and improved method for fabricating flexible and transparent devices at lower temperatures.

It is another object of the present invention to provide an active matrix display incorporating an oxide TFT directly with a III-V (e.g. GaN) LED array.

It is another object of the present invention to provide an active matrix display with an extremely high brightness.

It is another object of the present invention to provide an active matrix display having higher contrast.

It is another object of the present invention to provide an active matrix display having longer lifetime.

SUMMARY OF THE INVENTION

The present invention cures the deficiencies in the prior art by providing a method for integrating inorganic LED with oxide TFT for display applications. An oxide TFT is a kind of field-effect transistor made by depositing thin forms of semiconductor active layer as well as the dielectric layer and metallic contacts over a supporting substrate. In oxide TFT the material of the electron channel is oxide. The present method involves the deposition of oxide TFT layers onto a previously fabricated GaN type LED substrate. By incorporating an oxide TFT with a III-V type (e.g. GaN) LED array an active matrix display is realized with extremely high brightness, high contrast, and extended lifetime.

In an illustrative embodiment of the present invention, a method of fabricating an active matrix display is disclosed. The steps include forming an array of inorganic light emitting diodes (LEDs) over a substrate defining a plurality of sub-pixels, depositing an insulating layer over the inorganic LED array, forming conductive vias through the insulating layer, one via for each LED in the LED array, and forming a metal oxide thin film transistor backplane, including an array of pixel driver circuits, over the dielectric layer and conductive vias, wherein one driver circuit electrically controls each sub-pixel through the dielectric layer.

The inorganic LED array may include forming a first type semiconductive layer on the substrate, and a second or opposite type semiconductive layer formed on the first type semiconductive layer. The emission layer may be positioned between the first and second semiconductive layers. The method may further comprise an n-electrode connected to the first type semiconductive layer and a p-type electrode connected to the second type semiconductive layer. The first and second semiconductive layers may comprise III-V or II-VI group semiconductor materials. The III-V compound semiconductor may be GaN. The first type semiconductive layer may be an n-type GaN semiconductor. The n-electrode may be connected to the n-type GaN semiconductor. The second type semiconductive layer may be a p-type GaN semiconductor. The p-electrode may be connected to the p-type GaN semiconductor.

The metal oxide thin film transistor backplane may be formed over the insulating layer by forming a gate electrode made of a conductive material formed over a portion of the insulating layer, depositing a gate insulating film on the gate electrode, depositing a metal oxide semiconductor layer, patterning the semiconductor layer to form a channel region on the gate insulating film, and depositing a source electrode and drain electrode over the gate insulating film.

The display may further include a first conductive via plug contacting the n-electrode of the LED to the source electrode of the thin film transistor, and a second conductive via plug contacting the p-electrode of the LED to the drain electrode of the thin film transistor. The substrate may be transparent or sapphire. The insulating layer may be silicon dioxide.

In accordance with another illustrative embodiment of the present invention, a method of fabricating a light emitting device is disclosed. The steps include forming a compound stacked semiconductor structure over a substrate, wherein the semiconductor structure includes an n-type type semiconductive layer formed on the substrate comprising a material selected from the group consisting of III-V and II-VI compounds, a p-type semiconductive layer overlying the n-type semiconductive layer comprising a material selected from the group consisting of III-V and IV-VI compounds, electrically coupling a first electrode with the n-type semiconductive layer, and electrically coupling a second electrode with the p-type semiconductive layer. Then, forming an insulating layer comprising dielectric material over the semiconductor structure in a manner which does not cause significant damage to the structure. Then, forming conductive vias through the insulating layer, and forming a metal oxide thin film transistor backplane over the insulating layer and conductive vias in a manner which does not cause significant damage to the semiconductor structure.

The method may include forming a metal oxide thin film transistor backplane over the insulating layer by forming a gate electrode made of a conductive material formed over a portion of the insulating layer, depositing a gate insulating film on the gate electrode, depositing a metal oxide semiconductor layer, patterning the semiconductor layer to form a channel region on the gate insulating film, and depositing a source electrode and drain electrode over the gate insulating film.

The method may include a first conductive via contacting the first electrode of the semiconductor structure to the source electrode of the thin film transistor, and a second conductive via contacting the second electrode of the semiconductor structure to the drain electrode of the thin film transistor.

The conductive vias may be formed by patterning by etching.

In another illustrative embodiment of the present invention, a method of fabricating a light emitting device is disclosed by integrating a compound stacked semiconductor structure over a substrate, wherein the semiconductor structure includes material selected from the group consisting of III-V and II-VI compounds; forming an insulating layer over the semiconductor structure; and forming a metal oxide thin film transistor backplane over the insulating layer.

In another illustrative embodiment of the present invention, a device comprising an array of inorganic LEDs made by the method described above is disclosed. The device may be a display or a microdisplay.

These advantages of the present invention will be apparent from the following disclosure and the appended claims.

BRIEF DESCRIPTION OF THE DRAWINGS

To these and to such other objects that may hereinafter appear, the present invention relates to methods of monolithically integrating inorganic LEDs with metal oxide TFTs for display applications as described in detail in the following specification and recited in the annexed claims, taken together with the accompanying drawings, in which like numerals refer to like parts in which:

DETAILED DESCRIPTION

The present invention is directed to methods of integrating light emitting diodes (LEDs) with thin film transistors (TFTs) for display applications. In particular, the present invention utilizes III-V or II-VI group compound semiconductor materials to form LED devices. These materials require temperatures greater than 700 C for processing. It should be noted that the materials and processes described herein are for illustrative purposes and the present invention is not limited to the specific LED devices or TFT configurations described.

Figure 1:
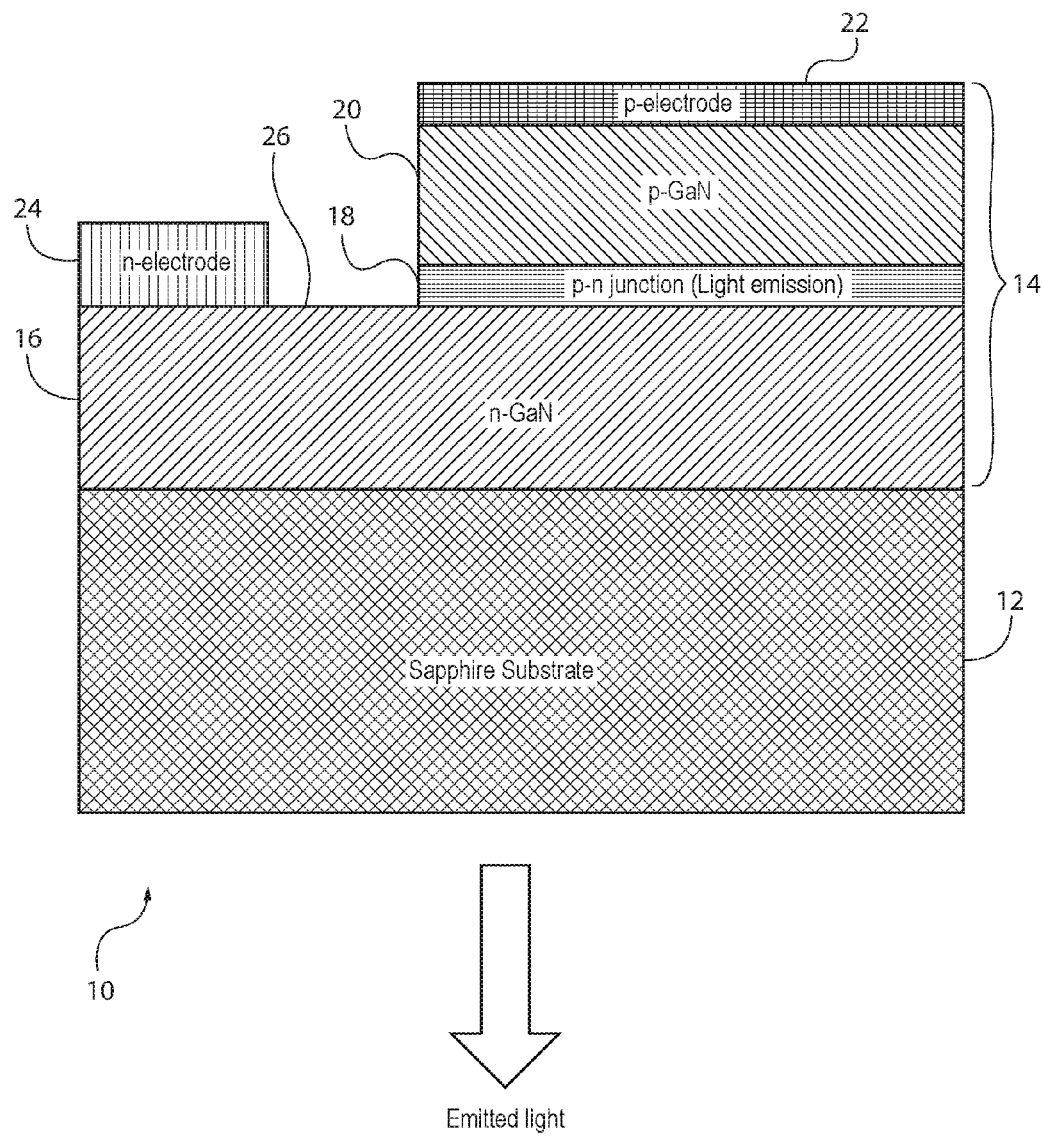
FIG. 1 is a layer diagram illustrating a GaN LED structure in a process for integrating light emitting diode with oxide thin film transistor according to an illustrative embodiment of the present invention.

FIGS. 1-4 illustrate the sequence of steps used in fabricating a TFT array on a LED array, having a plurality of sub-pixels, according to the present method. FIG. 1 illustrates an LED wafer 10 according to an illustrative embodiment of the present invention. The LED wafer 10 includes a stacked structure 14 composed on a transparent substrate 12. The structure 14 includes a first type semiconductive layer 16 positioned on the substrate 12, a p-n junction 18 containing a light emission region, a second type semiconductive layer 20 on top of the p-n junction 18, a p-type electrode 22, and an n-type electrode 24. The LED wafer 10 is patterned into an array of LEDs. It should be understood that the LED wafer 10 may be formed in accordance with techniques known in the art, such as by forming, for example, a gallium nitride (GaN) LED structure on a base sapphire substrate. It should be noted that while the term "wafer" is used to depict the overall structure, any wafer, portion of a wafer, chip, etc. may be used.

In the preferred embodiment, the transparent substrate 14 is sapphire. The first type semiconductive layer 16 is an n-type GaN semiconductor, which is formed over the sapphire substrate 12. The p-n junction 18, or emission layer, is then formed over the n-type GaN semiconductor. The second type semiconductive layer 20 is a p-type GaN semiconductor, which is formed over the emission layer 18. Since sapphire is dielectric, a portion of the stacked structure 14 of the LED wafer 10 has to be etched, exposing a portion 26 of the n-type GaN semiconductor layer 16. The n-type electrode 24 is formed on the exposed portion 26 of the n-type GaN semiconductor layer 16. The p-type electrode 22 is formed on the p-type GaN semiconductor layer 20. It should be noted that the first semiconductive layer may be either n or p type conductivity, and the second semiconductive layer is of opposite conductivity material (i.e. p or n).

Figure 2:
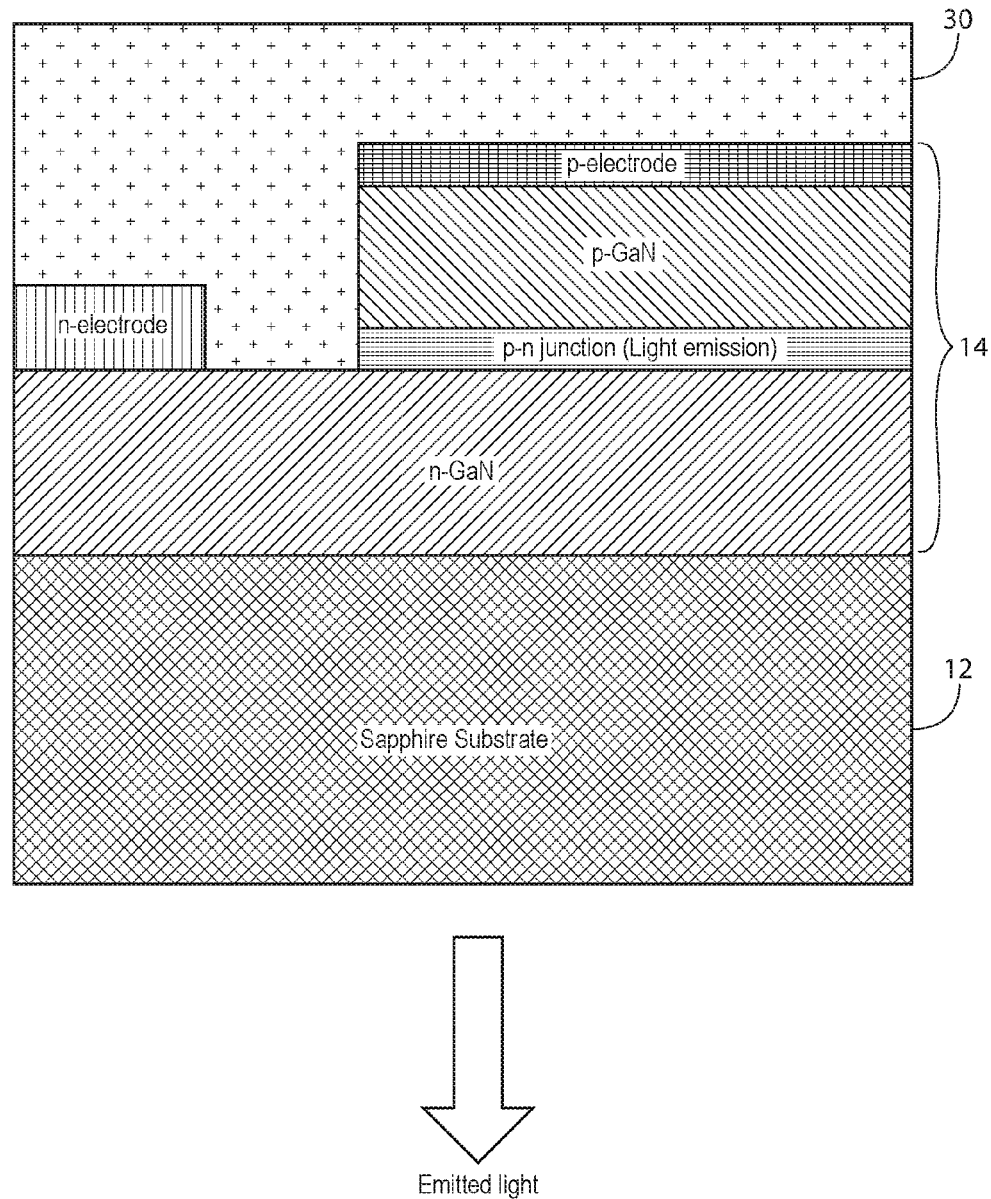
FIG. 2 is a layer diagram of the GaN LED of FIG. 1, illustrating the steps in the process of forming an insulation layer over the GaN LED according to an illustrative embodiment of the present invention.

FIG. 2 illustrates the fabricated LED wafer 10 covered with an insulating layer 30 of dielectric material, preferably silicon dioxide (SiO2). The insulating layer 30 is deposited over the array of LEDs by techniques known in the art, which may include at approximately 1 um using thermal oxidation techniques. The insulating layer 30 may have a thickness in the range of 0.5 to 2 microns. One driver circuit electrically controls each sub-pixel through the insulating layer 30.

Figure 3:
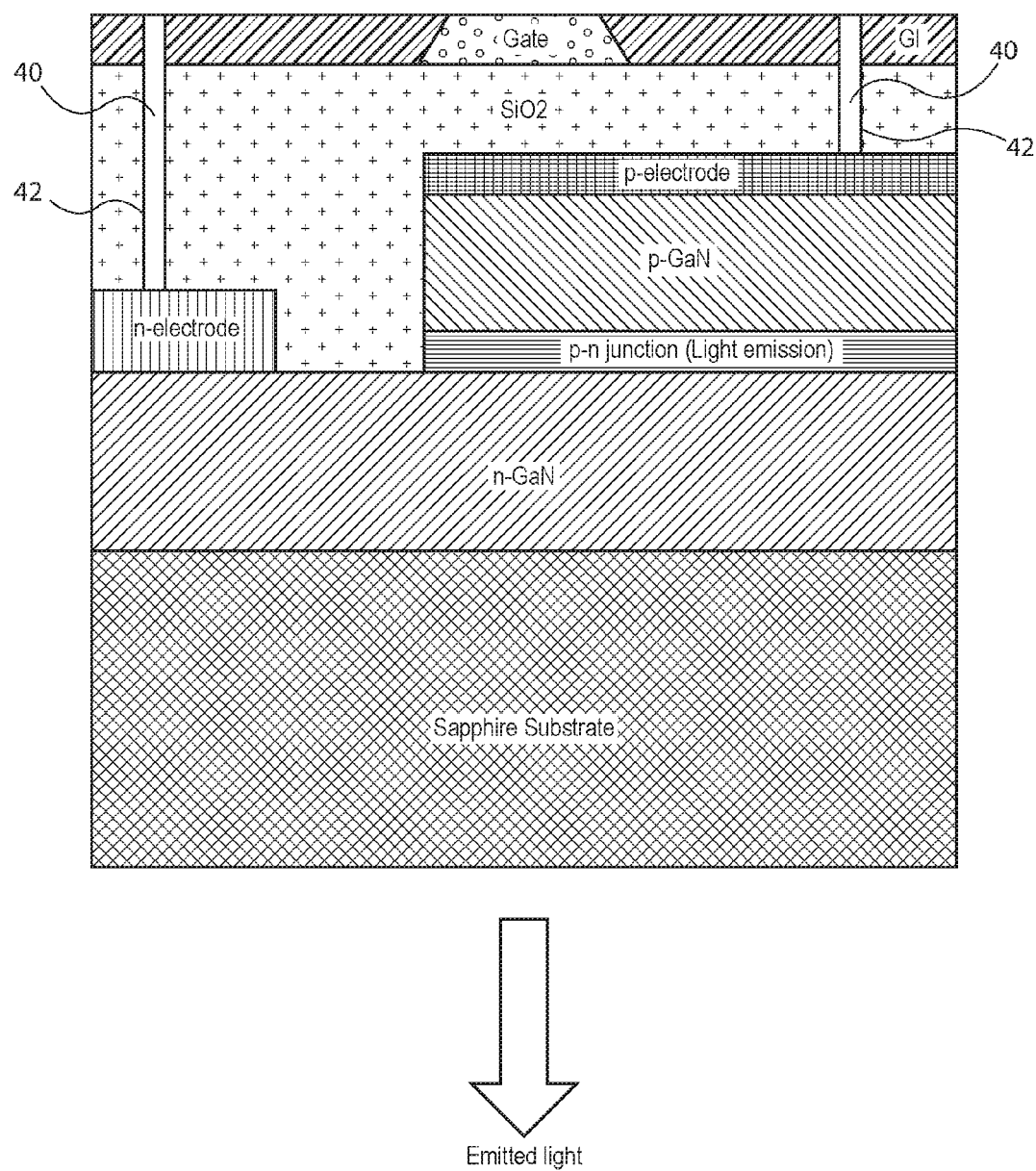
FIG. 3 is a layer diagram illustrating the steps in the process of fabricating a gate dielectric layer and vias for connecting electrodes of the LED to driver circuits above the insulation layer according to an illustrative embodiment of the present invention.

FIG. 3 illustrates the fabrication of conductive via plugs 40 formed through the insulating layer 30. According to an illustrative embodiment of the present invention, patterning the insulated layer 30, which may include conventional photolithographic techniques to mask portions of the insulating layer 30 and to expose portions where future vias 42a are to be formed, forms the conductive vias 42a. The exposed portions are then removed by etching or other suitable removal technique known in the art. One via is formed for each LED in the LED array. The method of patterning silicon dioxide is well known to experts in the field.

Following the patterning of the insulated layer 30, conductive via plugs 40 are formed within vias 42. According to an illustrative embodiment of the present invention, a material deposition system is used to deposit a conductive material, for example (ADD), in vias 42 for forming via plugs 40 one at a time. It should be noted that other systems and methods known in the art may be similarly used.

Figure 4:
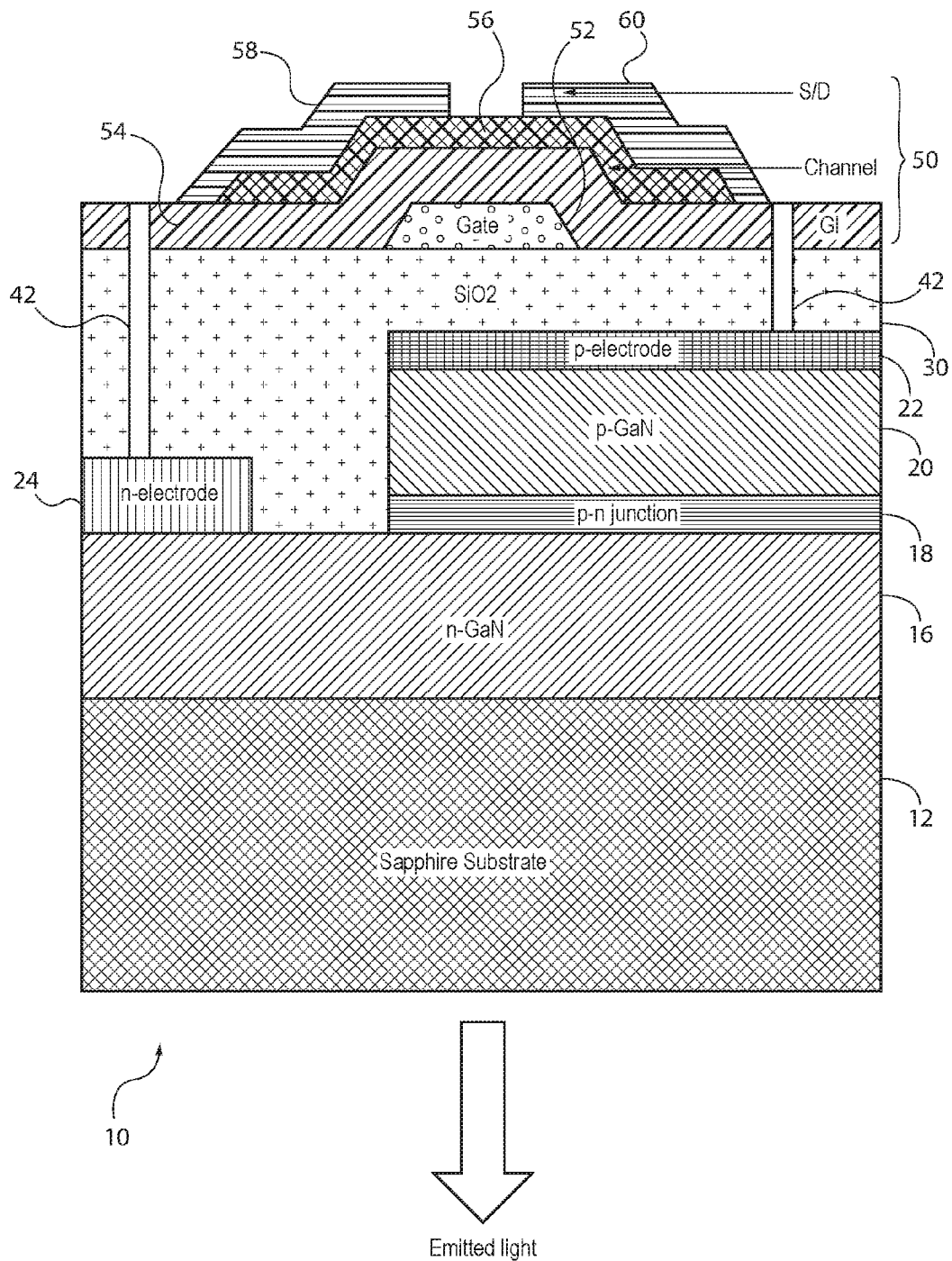
FIG. 4 is a layer diagram illustrating the steps in the process of fabricating a TFT array above the LED array of FIG. 4 according to an illustrative embodiment of the present invention.
Figure 5:
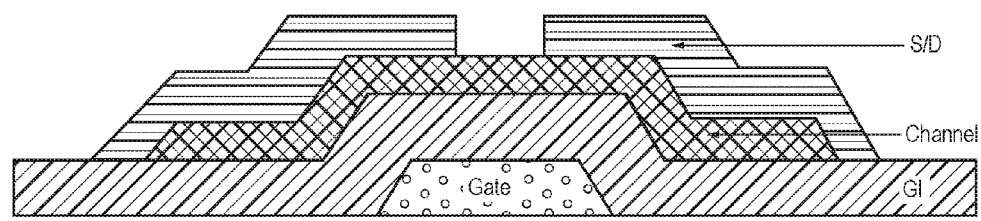
FIG. 5 is a layer diagram illustrating an oxide TFT structure in a process for integrating light emitting diode with oxide thin film transistor according to an illustrative embodiment of the present invention.

FIG. 4 illustrates a sectional view of the steps forming layers of the metal oxide thin film transistor structure 10 over the insulating layer 30 in accordance with an illustrative embodiment of the present invention. The TFT structure 50 has source 58, drain 60, channel 56, gate insulator 54, and gate 52 regions.

The gate metal 52 is deposited and patterned onto the insulating layer, preferably using a mask technique. It should be noted that other methods known in the art may be similarly used. The gate insulator layer 54 of dielectric material, is then deposited over the gate metal 52.

Vias are needed to connect the gate metal to subsequent metal layers to complete various circuits in the active matrix. In other embodiments, vias between the gate metal layer and the source/drain metal layer can be made easily and efficiently by using a laser. In other embodiments, vias are formed using photoresist, patterning, and an anisotropic etching. Vias 42b are opened through the gate insulating layer 54. A metal oxide semiconductor layer is then deposited as a blanket layer and patterned to form the channel 56 for a TFT.

The blanket source and drain metallization layer is then deposited over the structure and patterned to separate the metal layer into source and drain electrode contacts 58, 60. In other embodiments, laser doping techniques known in the art, may be used to form the TFT source and drain regions. The source and drain contacts, 58 and 60 respectively, are on opposite sides of the active area of the channel 56 and form a contact with the n-electrode 24 and p-electrode 22 through vias 42.

It is to be understood that the disclosure describes a few embodiments and that many variations of the invention can easily be devised by those skilled in the art after reading this disclosure and that the scope of the present invention is to be determined by the following claims.

What is claimed is:

1. A method of fabricating an active matrix display, the steps comprising:

forming an array of inorganic light emitting diodes (LEDs) over a substrate defining a plurality of sub-pixels, wherein the inorganic LED array including a first type semiconductive layer on the substrate and a second or opposite type semiconductive layer formed on the first type semiconductive layer, further including an n-electrode connected to the first type semiconductive layer and a p-type electrode connected to the second type semiconductive layer;

depositing an insulating layer over the inorganic LED array;

forming conductive vias through the insulating layer, one via for each LED in the LED array including a first conductive via plug and a second conductive via plug;

forming a metal oxide thin film transistor backplane, including an array of pixel driver circuits, over the dielectric layer and conductive vias, wherein one driver circuit electrically controls each sub-pixel through the dielectric layer, and further including:

forming a gate electrode made of a conductive material formed over a portion of the insulating layer;

depositing a gate insulating film on the gate electrode;

depositing a metal oxide semiconductor layer;

patterning the semiconductor layer to form a channel region on the gate insulating film;

depositing a source electrode and drain electrode over the gate insulating film; and wherein the first conductive via plug contacting the n-electrode of the LED to the source electrode of the thin film transistor, and the second conductive via plug contacting the p-electrode of the LED to the drain electrode of the thin film transistor.

2. The method of claim 1 wherein an emission layer is positioned between the first and second semiconductive layers.

3. The method of claim 2 wherein the first and second semiconductive layers are comprised of III-V or II-VI group semiconductor materials.

4. The method of claim 3 wherein the III-V compound semiconductor is GaN.

5. The method of claim 4 wherein the first type semiconductive layer is an n-type GaN semiconductor.

6. The method of claim 5 further comprising an n-electrode connected to the n-type GaN semiconductor.

7. The method of claim 4 wherein the second type semiconductive layer is a p-type GaN semiconductor.

8. The method of claim 7 further comprising a p-electrode connected to the p-type GaN semiconductor.

9. The method of claim 1 wherein the substrate is transparent.

10. The method of claim 1 wherein the substrate is sapphire.

11. The method of claim 1 wherein the insulating layer is silicon dioxide.

12. A method of fabricating a light emitting device, comprising the steps of:
   forming a compound stacked semiconductor structure over a substrate, wherein the semiconductor structure including:
      an n-type type semiconductive layer formed on the substrate comprising a material selected from the group consisting of III-V and II-VI compounds;
      a p-type semiconductive layer overlying the n-type semiconductive layer comprising a material selected from the group consisting of III-V and IV-VI compounds;
      electrically coupling a first electrode with the n-type semiconductive layer; and
      electrically coupling a second electrode with the p-type semiconductive layer;
   forming an insulating layer comprising dielectric material over the semiconductor structure in a manner which does not cause significant damage to the structure;
   forming conductive vias through the insulating layer;
   forming a metal oxide thin film transistor backplane over the insulating layer and conductive vias in a manner which does not cause significant damage to the semiconductor structure including:
      forming a gate electrode made of a conductive material formed over a portion of the insulating layer;
      depositing a gate insulating film on the gate electrode;
      depositing a metal oxide semiconductor layer;
      patterning the semiconductor layer to form a channel region on the gate insulating film; and
      depositing a source electrode and drain electrode over the gate insulating film; and
   providing a first conductive via contacting the first electrode of the semiconductor structure to the source electrode of the thin film transistor; and
   a second conductive via contacting the second electrode of the semiconductor structure to the drain electrode of the thin film transistor.

13. The method of claim 12 wherein the conductive vias are formed by patterning by etching.

14. A device comprising a compound stacked semiconductor structure over a substrate with a metal oxide thin film transistor backplane made by the method of claim 12.

15. The device of claim 14, wherein the device is a display.

16. The device of claim 14, wherein the display is a microdisplay.

* * * * *